United States Patent [19]
Watarai

[11] Patent Number: 6,043,678
[45] Date of Patent: Mar. 28, 2000

[54] INPUT CIRCUIT

[75] Inventor: Seiichi Watarai, Tokyo, Japan

[73] Assignee: NEC Corporation, Japan

[21] Appl. No.: 08/905,497

[22] Filed: Aug. 4, 1997

[30] Foreign Application Priority Data

Aug. 8, 1996 [JP] Japan .................................. 8-210170

[51] Int. Cl.[7] .............................................. H03K 19/0175
[52] U.S. Cl. ................................. 326/64; 326/80; 326/84
[58] Field of Search ........................ 326/63–64, 109–110, 326/80–81, 84, 9

[56] References Cited

U.S. PATENT DOCUMENTS

| | | | |
|---|---|---|---|
| 4,810,903 | 3/1989 | Bushey et al. ............................. | 326/81 |
| 5,053,644 | 10/1991 | Shibata et al. . | |
| 5,057,713 | 10/1991 | Iwamura et al. . | |
| 5,218,243 | 6/1993 | Keown et al. ............................. | 326/84 |
| 5,365,124 | 11/1994 | Seta et al. . | |

FOREIGN PATENT DOCUMENTS 5-291935  11/1993  Japan .................................... 326/110

OTHER PUBLICATIONS

Patent Abstracts of Japan, vol. 010, No. 209 (E–421), Jul. 22, 1986 & JP 61 050421 A (Toshiba Corp; Others: 01), Mar. 12, 1986, * Abstract *.

Patent Abstracts of Japan, vol. 018, No. 161 (E–1526), Mar. 17, 1994 & JP 05 335930 A (Fujitsu Ltd; Others: 01), Dec. 17, 1993, * Abstract *.

*Primary Examiner*—Jon Santamauro
*Attorney, Agent, or Firm*—Ostrolenk, Faber, Gerb & Soffen, LLP

[57] ABSTRACT

According to the present invention, an input circuit is provided comprising: an input terminal; a first power source terminal; a second power source terminal; a first bipolar transistor; a second bipolar transistor; a first electric current cut off member; a second electric current cut off member; a voltage clamping member; and a buffer. As a result, even when an electric potential greater than that of the power source voltage is applied to the input terminal, regardless of the supply or interruption of the power source voltage, destruction of the internal components is prevented and a steady-state electric current of the power source voltage and/or the input terminal is cut off. Hence, providing a PMOS transistor and NMOS transistor, serves to cut off the electric current routes of power source terminal VDD and the ground terminal. It is thus possible to cut off the electric current flowing from the power source terminal to the input and ground terminals while also preventing the destruction of the components relating to the increased signal.

15 Claims, 4 Drawing Sheets

INPUT CIRCUIT

BACKGROUND OF THE INVENTION

1. Technical Field of the Invention

With regard to an input circuit and an output circuit for use in handling the reception and transmission of data signals generated at the time of transmitting data between integrated circuits, the present invention relates, in particular, to an input circuit.

2. Background Art

Generally, this type of input circuit is employed, in particular as a means for receiving data signals, when data is transmitted between different integrated circuits, such as in a transmission circuit of a bus line or the like. In the case of a logical signal transmission, either a high level or low level signal is received. Consequently, in the input circuit, an input terminal for receiving data signals from other integrated circuits, and an output circuit for propagating these data signals within its own integrated circuit invariably exist.

In addition, with regard to the data transmission of a logical signal, a level standard is invariably defined in order discriminate between a high level or low level signal. Consequently, when transmitting data between integrated circuits, it is absolutely necessary to conduct the transmission without disruption of the defined standard regardless of the level. Currently, with regard to a Transistor Transistor Logic (hereafter abbreviated as "TTL") an interface standard which is an example of a data transmission standard, defines the minimum value of a "high level" transmission signal (hereafter abbreviated as "VOHMIN") is defined as 2.4 V. In addition, the maximum value of a "low level" transmission signal (hereafter abbreviated as "VOLMAX") is defined as 0.4 V.

However, in the TTL interface standard, both the maximum value of a "high level" transmission signal (hereafter abbreviated as "VOHMAX") and the minimum value of a "low level" transmission signal (hereafter abbreviated as "VOLMIN") are not stipulated. As a result, almost all of the VOHMAX values reach or approach the maximum value of the integrated circuit power source electric potential, while nearly all of the VOLMIN values reach or approach the minimum value of the integrated circuit ground (earth) electric potential. With respect to the nonspecification of the VOHMAX and VOLMIN, the same can be said for the CMOS interface, which has enjoyed wide use in the recent past. Hence, in a manner similar to the previously described TTL interface, these limiting values generally follow closely the power source electric potential and ground (earth) electric potential of the integrated circuit.

However, a reduction in the power source electric potential supplied to the integrated circuit has accompanied progress in the refinement of the integrated circuit, such that destruction of the components comprising the integrated circuit results from the supply of an unreduced power source electric potential. As a result, reduction of the power source electric potential must accompany the refinement of an integrated circuit. However, it has come to the point where data transmission between integrated circuits possessing different power source electric potentials (e.g., 5 V and 3 V power sources) also occurs.

Still, as in the example of the TTL interface described above, problems in data transmission do not arise as long as the standards for the lowest limits of VOHMIN and VOLMAX are satisfied. However, with regard to VOHMAX in which a standard is particularly undefined, problems arise due to the coexistence of two levels, one approximating the 5 V power source electric potential and another near the level of the 3 V power source.

Hence, as explained above, the supply of, for example, a 5 V power source electric potential to an integrated circuit possessing a 3 V power source results in the destruction of the components of the latter. On the other hand, when an integrated circuit possessing a 3 V power source receives a VOHMAX signal of 5 V or a similar level thereof, destruction of the components comprising the input circuit of the integrated circuit possessing the aforementioned 3 V power source occurs. As a result, a necessity has arisen to allow for the reception of data signals from integrated circuits possessing high power source electric potentials, e.g., 5 V power source, by the input circuit of an integrated circuit possessing a low power source electric potential, e.g., 3 V power source.

Various proposals already exist for an input circuit which is able to receive signal levels which exceed the power source electric potential of its own integrated circuit. Examples of these previous disclosures will be presented in the following.

Figure 3:
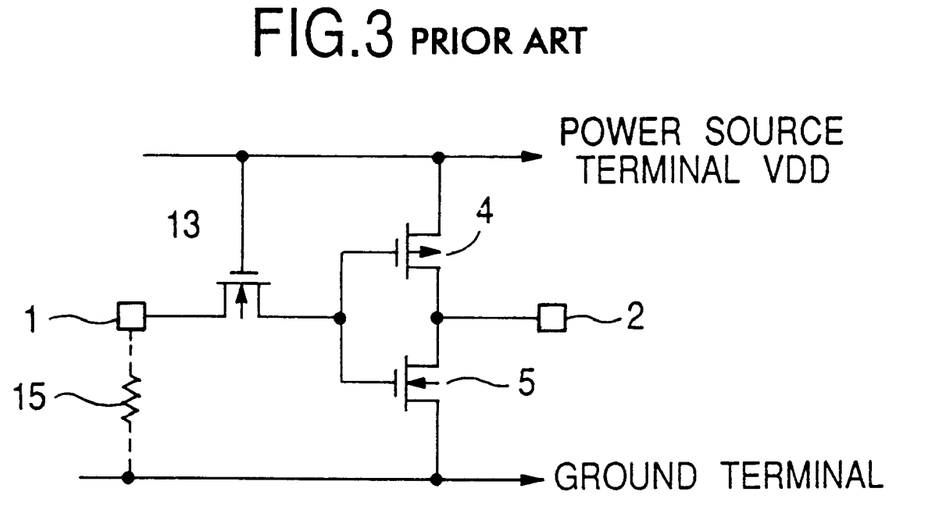
FIG. 3 is a circuit diagram according to a first conventional example.

FIG. 3 shows a conventional example of an input circuit loaded onto a CMOS integrated circuit. In FIG. 3, the drain of NMOS transistor 13 is connected to input terminal 1. The gates of PMOS transistor 4 and NMOS transistor 5 are respectively connected to the source of NMOS transistor 13. In addition, the drains of PMOS transistor 4 and NMOS transistor 5 are respectively connected to output terminal 2. The gate of NMOS transistor 13 and the source of PMOS transistor 4 are respectively connected to power source terminal VDD, with the source of NMOS transistor 5 connected to the ground. In addition, a resistance component 15 is also provided in the figure.

In FIG. 3, a state is initially assumed in which 3 V is supplied to power source terminal VDD, while a high level signal of 5 V is applied to input terminal 1 from another integrated circuit. In this case, since 3 V is supplied to the gate of NMOS transistor 13 while an electric potential of 5 V is supplied to the drain of NMOS transistor 13, the source electric potential of NMOS transistor 13 (currently in a conducting state) is reduced from 3 V by VTN (wherein VTN is the threshold value of NMOS transistor 13) to afford a reduced electric potential.

In this manner, only an electric potential of (3 V–VTN) is imparted to the gate terminals of PMOS transistor 4 and NMOS transistor 5, which thus avoids the destruction of the gate oxide films of these aforementioned PMOS transistor 4 and NMOS transistor 5. In most cases, the threshold value VTN of NMOS transistor 13 is normally set to zero. As a result, an unreduced electric potential of 3 V is supplied to the respective gates of PMOS transistor 4 and NMOS transistor 5. Under these circumstances, PMOS transistor 4 assumes a nonconducting state, with NMOS transistor 5 in a conducting state. Therefore, a converted level which is equal to the low level of the ground electric potential is maintained in output terminal 2, and this level is propagated in an unaltered form to the internal circuitry of the integrated circuit connected to this output terminal 2.

On the other hand, in FIG. 3, the outcome differs when a state is assumed in which 3 V is supplied to power source terminal VDD, while a low level signal equal to the ground electric potential is applied to input terminal 1 from another integrated circuit. In this case, the ground electric potential is applied to the drain of NMOS transistor 13, while an electric potential of 3 V is supplied to the gate of NMOS transistor 13. As a result, the source electric potential of the conducting NMOS transistor 13 is equal to the drain electric potential therein. Hence, a ground electric potential is imparted to the respective gate terminals of PMOS transistor 4 and NMOS transistor 5, such that the destruction of the gate oxide films of these aforementioned PMOS transistor 4 and NMOS transistor 5 does not occur. Under these circumstances, NMOS transistor 5 assumes a nonconducting state, with PMOS transistor 4 in a conducting state. Therefore, a converted level which is equal to the 3 V high level of the electric potential generated by power source terminal VDD is maintained in output terminal 2, and this level is propagated in an unaltered form to the internal circuitry of the integrated circuit connected to this output terminal 2.

However, the first conventional example shown in FIG. 3 has the following two problems. The first problem arises from the extremely large component size of NMOS transistor 13, as well as the large component area of the components comprising the input circuit. Generally, the resistance during conduction of the MOS transistor decreases with increasing gate width. However, in the case of NMOS transistor 13, in the circuit shown in FIG. 3, a high conduction resistance causes a large increase in the time required for a high level to low level conversion, or vice versa, of the electric potential applied to input terminal 1, thus rendering high-speed operation impossible. In addition, this conversion time is proportional to the resistance over the source and drain segment during conduction of NMOS transistor 13. Consequently, it is desirable for the resistance during conduction over the source and drain segment of NMOS transistor 13 to equal the lowest value possible, which in turn requires an enlargement of the gate width of NMOS transistor 13.

The second problem arises in the case when an electric potential value greater than that of power source terminal VDD is applied to input terminal 1 of FIG. 3, such that the electric potential supplied to power source terminal VDD is cut off. In this case, output of a reduced electric potential (VDD−VTN) from the source terminal of NMOS transistor 13 is not possible, which in turn allows the propagation of an electric potential equal to input terminal 1. As a result, the electric potential applied to input terminal 1, which is higher than that of power source terminal VDD, is propagated to the respective gate terminals of PMOS transistor 4 and NMOS transistor 5, thereby causing the destruction of the gate oxide films of these aforementioned transistors.

Figure 4:
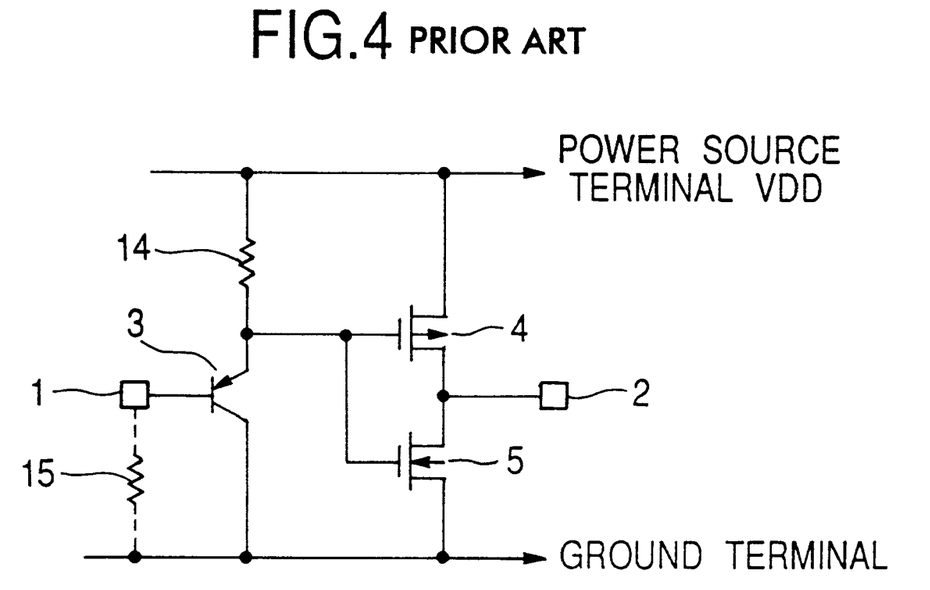
FIG. 4 is a circuit diagram according to a second conventional example.

In order to solve these types of problems, an input circuit has been proposed which applies the BiCMOS integrated circuit technology, an example of which will be described in the following. FIG. 4 represents a second example showing an input circuit which applies the BiCMOS integrated circuit technology. In FIG. 4, the base of a PNP-type bipolar transistor 3 (hereafter abbreviated as "PNP transistor") is connected to input terminal 1. Additionally, the gates of PMOS transistor 4 and NMOS transistor 5, as well as one terminal of resistance component 14, are connected respectively to a collector of PNP transistor 3. The drains of PMOS transistor 4 and NMOS transistor 5 are connected respectively to output terminal 2, while the other terminal of resistance component 14, in addition to the source of PMOS transistor 4 are connected respectively to power source terminal VDD. Also, the aforementioned collector of PNP transistor 3 and source of NMOS transistor 5 are both grounded.

In FIG. 4, a state is initially assumed, as in FIG. 3, in which 3 V is supplied to power source terminal VDD, while a high level signal of 5 V is applied to input terminal 1 from another integrated circuit. In this case, since the segment between the base and emitter of PNP transistor 3 forms a reverse buffer, the electric potential of input terminal 1 is not propagated to the emitter of PNP transistor 3. Consequently, by means of resistance component 14, an electric potential equal to that of power source terminal VDD (i.e., 3 V) is supplied to the respective gates of PMOS transistor 4 and NMOS transistor 5. As a result, the destruction of the gate oxide films of PMOS transistor 4 and NMOS transistor 5 does not occur. Under these circumstances, PMOS transistor 4 assumes a nonconducting state, with NMOS transistor 5 in a conducting state. Therefore, a converted level which is equal to the low level of the ground electric potential is maintained in output terminal 2, and this level is propagated in an unaltered form to the internal circuitry of the integrated circuit connected to this output terminal 2.

On the other hand, in FIG. 4, the outcome differs when a state is assumed in which 3 V is supplied to power source terminal VDD, while a low level signal equal to the ground electric potential is applied to input terminal 1 from another integrated circuit. In this case, the ground electric potential is applied to the base of PNP transistor 3, while an electric potential of 3 V (i.e., the power source electric potential) is supplied to the emitter of PNP transistor 3 via resistance component 14. As a result, PNP transistor 3 assumes a conducting state. Hence, a ground electric potential is imparted to the respective gate terminals of PMOS transistor 4 and NMOS transistor 5, which, in turn, prevents the destruction of the gate oxide films of these aforementioned PMOS transistor 4 and NMOS transistor 5. Under these circumstances, NMOS transistor 5 assumes a nonconducting state, with PMOS transistor 4 in a conducting state. Therefore, a converted level which is equal to the 3 V high level of the electric potential generated by power source terminal VDD is maintained in output terminal 2, and this level is propagated in an unaltered form to the internal circuitry of the integrated circuit connected to this output terminal 2.

The second conventional example shown in FIG. 4 solves the two problems of the first conventional example shown in FIG. 3 in the following manner. In the first conventional example shown in FIG. 3, the components comprising NMOS transistor 13 occupy an area of 11720 $\mu m^2$ (117.2 $\mu m \times 100$ $\mu m$). In contrast, in the second conventional example shown in FIG. 4, PNP transistor 3 and resistance component 14 occupy an area of just 833 $\mu m^2$ (17 $\mu m \times 49$ $\mu m$)—even when including the area separating the two components—which is approximately 7% of the area occupied by NMOS transistor 13.

Here, the gate length and width of NMOS transistor 13 are 1.8 $\mu m$ and 1272 $\mu m$, respectively. Additionally, the emitter area of PNP transistor 3 is 3×3 $\mu m^2$ with a 10 kΩ resistance component 14. In this manner, the second conventional example clearly solves the problem of the large area occupied by the components of NMOS transistor 13 of the first conventional example.

In the following, a case will be described, for the example shown in FIG. 4, in which an electric potential greater than that of power source terminal VDD is supplied to input terminal 1, wherein the electric potential supplied to power source terminal VDD is cut off. In this aforementioned state, due to the reverse buffer state that exists between the base and emitter of PNP transistor 3, there is no formation of an electric current route from the input terminal to power source terminal VDD. Consequently, there is no propagation of an electric potential (applied to input terminal 1) which exceeds that of the power source terminal to the gate terminals of PMOS transistor 4 and NMOS transistor 5. In other words, the destruction phenomenon of the gate oxide films of PMOS transistor 4 and NMOS transistor 5 does not occur.

Furthermore, PNP transistor 3 utilizes a lateral PNP transistor which is characterized by large, permanent voltages of approximately 10 to 20 V which can be applied from the base to the emitter, and from the base to the collector. This lateral PNP transistor is also advantageous in that it can be easily manufactured by means of a conventional BiCMOS process.

By means of a construction in which the base of a PNP transistor is connected to input terminal 1 with the emitter of PNP transistor 3 connected between the aforementioned base and the power source terminal VDD via resistance component 14, the aforementioned input circuit according to the second conventional art shown in FIG. 4 prevents the destruction of the gate oxide films of PMOS transistor 4 and NMOS transistor 5 even in the case when, a signal of a higher level than the electric potential of the power source terminal VDD is applied to input terminal 1 with interruption (cut off) of the electric potential of the power source terminal VDD. However, this aforementioned second conventional art poses problems due to the existence of a two electric current routes from the power source terminal VDD to the ground terminal and input terminal, respectively.

To begin with, the first electric current route from the power source terminal VDD to the ground terminal will be explained. In FIG. 4, assuming a state in which a low level is applied to input terminal 1 from another integrated circuit, due to the conducting state of PNP transistor 3, a first electric current route exists between the power source terminal VDD and the ground terminal via resistance component 14. Since the resistance of resistance component 14 is normally set to a value between 1 kΩ and 10 kΩ, assuming a power source electric potential VDD of 3 V, an electric current of 0.3 mA to 3 mA regularly flows down the aforementioned first electric current route.

In the following, a second electric current route from the power source terminal VDD to the ground terminal will be explained. In FIG. 4, assuming a state in which a low level is applied to input terminal 1 from another integrated circuit, due to the conducting state of PNP transistor 3, a second electric current route exists between the power source terminal VDD and input terminal 1 by means of the forward directional path between the emitter and base of PNP transistor 3. With regard to this PNP transistor, in particular in the case of the aforementioned lateral PNP transistor, generally a small value, a minimum value being (a factor of) 10 or less (note: multiplication factors are used instead of units) for the forward directional current gain is not unusual. Hence, in consideration of dispersion of the manufacturing process, there are times when the minimum value may drop to as low as 1. In the above case, this means that the electric current flowing from the emitter to the collector equals the electric current flowing from the emitter to the base. Thus, in the case of the second conventional example shown in FIG. 4, half of the electric current flowing from the aforementioned power source terminal VDD via the resistance, flows over the path from the base of PNP transistor 3 to the input terminal.

When the aforementioned first electric current route flowing from the power source terminal to the ground via the collector of PNP transistor 3, and second electric current route flowing from the base of PNP transistor 3 towards input terminal 1 exist, the following problems arise. When a first electric current route flowing from the power source terminal to the ground terminal, and a second electric current route flowing from the base of PNP transistor 3 to input terminal 1 exist, the electric power consumed by the integrated circuit, onto which the input circuit is loaded, continues to increase or, alternatively, the calorific value of the integrated circuit increases. Moreover, in order to have quantitative dependency of the input circuits used in the aforementioned integrated circuit, there exists another problem in that the size of the aforementioned requires, in some cases, loading onto a package components of enormous size at great cost.

In addition, in the aforementioned input circuit, there are times when the input terminal enters a nonconducting state wherein neither a high or low level (signal) is applied thereto. In this nonconducting state, it becomes impossible to distinguish between a high level or low level. As a result, the input circuit normally decides to either keep the input terminal at a high level by means of providing a resistance component between the input terminal and power source terminal (hereafter referred to as "pull-up resistance"), or keep the input terminal at a low level by means of providing a resistance component between the input terminal and ground terminal (hereafter referred to as "pull-down resistance"). However, in the case when a voltage greater than that of the power source terminal is applied to the input terminal, application of the pull-down resistance is normally selected since selection of the pull-up resistance results in the unfavorable formation of an electric current route from the input terminal to the power source terminal. In addition, a markedly high resistance (of the resistance component) is used as the pull-down resistance, with a value of approximately 50 kΩ being the norm.

When applying a pull-down resistance, due to the flow of the electric current, which is coursing over the second electric current route from the power source terminal to the input terminal of the input circuit of the aforementioned second convention art, generation of an electromotive force occurs resulting in drawbacks such as disruption of the original low level and supply of a high level to the input terminal.

SUMMARY OF THE INVENTION

In order to address the problems posed by the aforementioned conventional art, it is an object of the present invention to provide, as a first aspect, an input circuit comprising:

input terminal for receiving an external signal;

first power source terminal;

second power source terminal for imparting a lower electric potential than the electric potential of said first power source terminal first bipolar transistor for propagating a high level applied to said input terminal;

second bipolar transistor for propagating a low level applied to said input terminal;

first electric current cut off means for cutting off an electric current route formed between said first bipolar transistor and said first power source terminal;

second electric current cut off means for cutting off an electric current route formed between said second bipolar transistor and said second power source terminal;

voltage clamping means for providing an electric potential which is lower than the electric potential of said first power source terminal to said second electric current cut off means, even in the case when an electric potential which is higher than the electric potential of said first power source terminal is applied to said input terminal; and buffer for propagating a high level, propagated by means of said first bipolar transistor, and a low level, propagated by said second bipolar transistor, within the interior of an integrated circuit.

In addition, according to a second aspect of the present invention, an input circuit is provided comprising:

input terminal for receiving an external signal;

first power source terminal;

second power source terminal for imparting a lower electric potential than the electric potential of said first power source terminal;

first bipolar transistor for propagating a high level applied to said input terminal;

second bipolar transistor for propagating a low level applied to said input terminal;

input impedance controlling means for adjusting the input impedance of said second bipolar transistor;

first electric current cut off means for cutting off an electric current route formed between said first bipolar transistor and said first power source terminal;

second electric current cut off means for cutting off an electric current route formed between said second bipolar transistor and said second power source terminal;

third electric current cut off means for cutting off an electric current route formed between said input impedance controlling means and said first power source terminal voltage clamping means for providing an electric potential which is lower than the electric potential of said first power source terminal to said second electric current cut off means, even in the case when an electric potential which is higher than the electric potential of said first power source terminal is applied to said input terminal; and buffer for propagating a high level, propagated by means of said first bipolar transistor, and a low level, propagated by said second bipolar transistor, within the interior of an integrated circuit.

Furthermore, it is preferred that said first electric current cut off means and said second electric current cut off means each comprise a MOS transistor. In addition, it is preferred that said buffer comprises two MOS transistors of mutual reverse polarity.

PREFERRED EMBODIMENTS OF THE INVENTION

Figure 1:
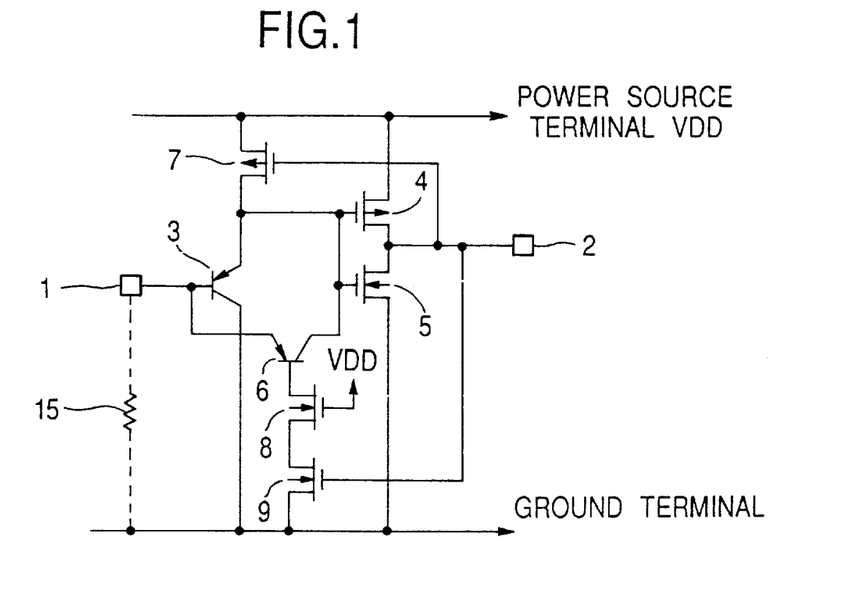
FIG. 1 is a circuit diagram according to a first preferred embodiment of the present invention.

In the following, a first preferred embodiment of the present invention will be explained using FIG. 1. In FIG. 1, the base of PNP transistor 3 and emitter of PNP transistor 6 are respectively connected to input terminal 1. In addition, the drain of PMOS transistor 7, gate of PMOS transistor 4, gate of NMOS transistor 5 and collector of PNP transistor 6 are respectively connected to the emitter of PNP transistor 3. The drain of NMOS transistor 8 is connected to the base of PNP transistor 6, and the drain of NMOS transistor 9 is connected to the source of NMOS transistor 8. The drain of PMOS transistor 4, drain of NMOS transistor 5, gate of PMOS transistor 7 and gate of NMOS transistor 9 are respectively connected to output terminal 2. Furthermore, the sources of PMOS transistor 4 and PMOS transistor 7, as well as a gate of NMOS transistor 8 are respectively connected to power source terminal VDD, while the sources of NMOS transistor 5 and NMOS transistor 9, in addition to a collector of PNP transistor 3 are respectively grounded.

In the following, the operation of a first preferred embodiment of the present invention will be explained. In FIG. 1, a state is assumed in which 3 V is supplied to power source terminal VDD, while a high level 5 V signal is applied to input terminal 1 from another integrated circuit. In this situation, since a reverse bias state occurs between the emitter and base of PNP transistor 3, the 5 V electric potential of input terminal 1 is not transmitted to the emitter of PNP transistor 3. In this state, PMOS transistor 7 maintains a conducting state, and as a result, a 3 V electric potential, equal to that of power source terminal VDD is supplied to the respective gates of PMOS transistor 4 and NMOS transistor 5. Consequently, destruction of the gate oxide films of PMOS transistor 4 and NMOS transistor 5 does not occur. According to this state, PMOS transistor 4 assumes a nonconducting state with NMOS transistor 5 in a conducting state. As a result, a converted level equal to the low level of the ground electric potential is maintained by output terminal 2, and this level is propagated in an unaltered form to the internal circuitry of an integrated circuit connected to output terminal 2.

At the same time, by means of a low level in output terminal 2, PMOS transistor 7 is maintained in a conducting state, while NMOS transistor 9 is maintained in a nonconducting state, as explained above. Consequently, the electric current route of forward bias between the emitter and base is interrupted (cut off) by means of utilizing NMOS transistor 9, thereby maintaining PNP transistor 6 in a nonconducting state. In this manner, NMOS transistor 9 serves as a second electric current cut off means. Normally, NMOS transistor 8 assumes a conducting state in order to prevent the destruction of the gate oxide film of NMOS transistor 9. The electric potential of the PNP transistor 6 base is reduced by only VEB from the 5 V electric potential applied to input terminal 1. Here, VEB represents the forward voltage flowing between the emitter and base of PNP transistor 6. Normally, VEB takes on a value of approximately 0.7 V, and thus the base electric potential of PNP transistor 3 is approximately 4.3 V. However, only an electric potential, which has been reduced from the 3 V electric potential supplied to power source terminal VDD by a value of only VTN via NMOS transistor 8, is applied to the drain of NMOS transistor 9. As a result, destruction of the gate oxide film of NMOS transistor 9 does not occur. In this manner, NMOS transistor 8 functions as a voltage clamping means.

On the other hand, in FIG. 1, a state is now assumed in which 3 V is supplied to power source terminal VDD with the signal from the other integrated circuit to input terminal 1, described in the aforementioned, changing from a high level to a low level (ground electric potential). In this case, a reduced electric potential which is converted from a 5 V electric potential to a ground electric potential is applied to the base of PNP transistor 3. In addition, since PNP transistor 3 switches from a nonconducting state to a conducting state, the emitter electric potential of PNP transistor 3 switches from the power source electric potential towards the ground electric potential. The gates of PMOS transistor 4 and NMOS transistor 5 are connected respectively to the emitter of PNP transistor 3. As a result, PMOS transistor 4 switches from a nonconducting state to a conducting state, while NMOS transistor 5 switches from a conducting state to a nonconducting state. Consequently, output terminal 2 converts from a low level to a high level, which is followed by the conversions of PMOS transistor 7 from a conducting state to a nonconducting state, and NMOS transistor 9 from a nonconducting state to a conducting state.

By means of using PMOS transistor 7, the electric current route between the emitter and base of PNP transistor 3 is interrupted (cut off), and PNP transistor 3 switches accordingly from a conducting state to a nonconducting state. In this manner, PMOS transistor 7 functions as a first electric current cut off means. In addition, by means of using NMOS transistor 9, an electric current route between the emitter and base of PNP transistor 6 is formed (connected), and thus PNP transistor 6 switches accordingly from a nonconducting state to a conducting state. At the point when the signal applied from the other integrated circuit to input terminal 1 completely reaches the ground electric potential, PMOS transistor 7 and PMOS transistor 4 are maintained in a nonconducting state, while NMOS transistor 5 and NMOS transistor 9 are maintained in a conducting state. Consequently, output terminal 2 maintains a high level equal to the 3 V electric potential of the power source terminal VDD, and this level is propagated in an unaltered form to the internal circuitry of the integrated circuit connecting with output terminal 2. In this manner, PMOS transistor 4 and NMOS transistor 5 function as buffers for transmitting a high level or low level to the interior of an integrated circuit.

As explained above, even in the case when a low level signal is applied to input terminal 1 by means of another integrated circuit, since PMOS transistor 7 maintains a nonconducting state, an electric current route flowing from the power source terminal VDD to the emitter of PNP transistor 3 does not exist. Consequently, a first electric current route flowing from the power source terminal VDD towards the ground terminal, and a second electric current route flowing from the power source terminal VDD towards input terminal 1 do not exist as in the aforementioned second conventional example. In other words, the problems posed by the second conventional example are completely solved by the aforementioned embodiment.

Figure 5:
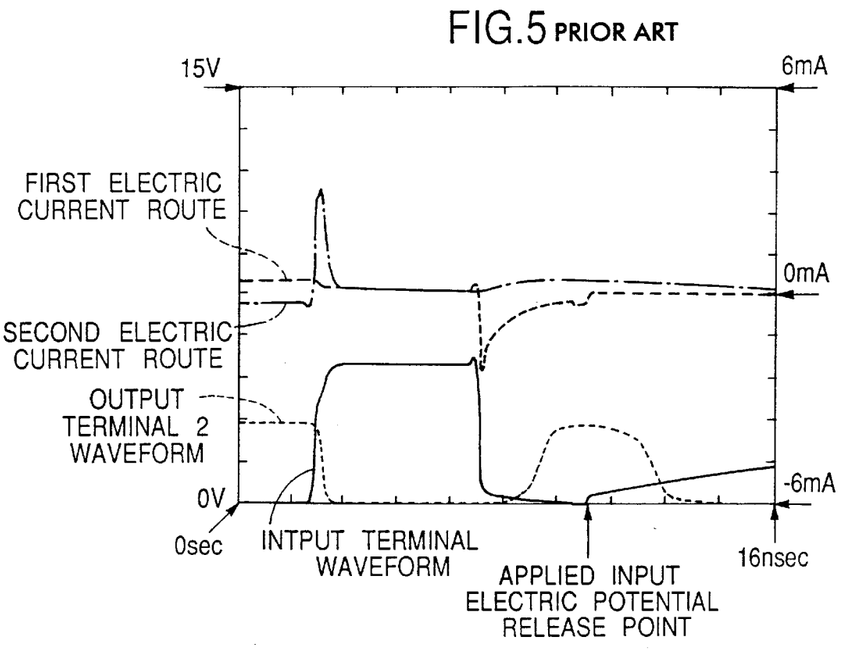
FIG. 5 is a diagram showing a characteristic simulation according to a second conventional example.
Figure 6:
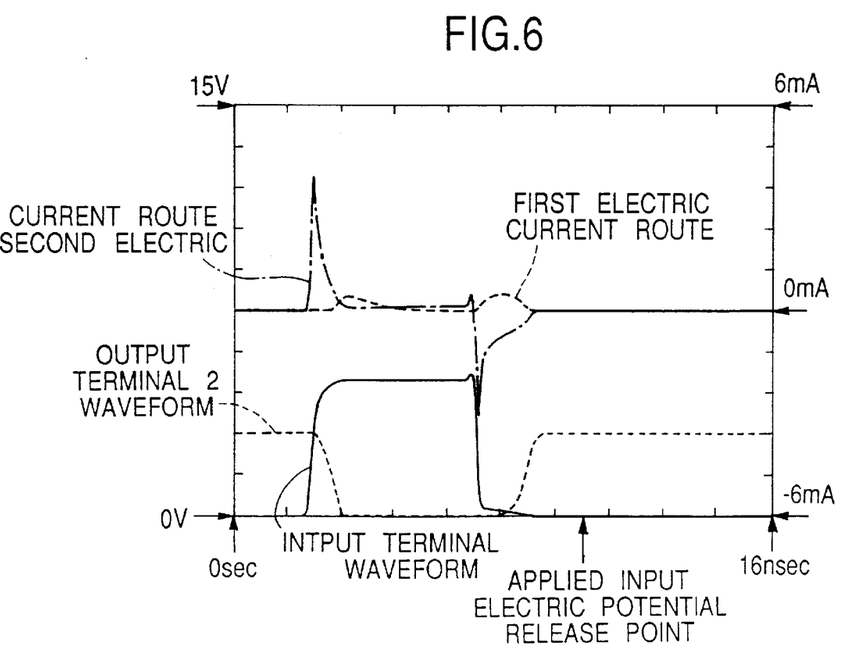
FIG. 6 is a diagram showing a characteristic simulation according to a first preferred embodiment of the present invention.

FIG. 5 is a diagram of a characteristic simulation showing an operation of the second conventional example shown in FIG. 4. FIG. 6 is a diagram of a characteristic simulation showing an operation of an input circuit according to a first preferred embodiment of the present invention. According to FIG. 5, in the input circuit of the second conventional example shown in FIG. 4, when the electric potential of input terminal 1 is 0 V, the electric currents flowing over the first electric current route from the power source terminal VDD towards the ground, and the second electric current route flowing from the power source terminal VDD towards input terminal 1 are 0.4 mA and 0.3 mA, respectively. In contrast, according to FIG. 6, in the input circuit of the present invention shown in FIG. 1, the electric currents flowing over the aforementioned first and second electric current routes are both equal to zero.

In addition, in FIG. 5, the electric potential of input terminal 1 increases with the release of applied input electric potential, after which a phenomenon in which the electric potential of output terminal 2 switches from a high level to a low level is observed. As a result of this phenomenon, the electric current flowing over the aforementioned second electric current route flows to the resistance component (pull down resistance) connecting between the input terminal and ground terminal, thereby giving rise to an electromotive force at both ends of the resistance which disrupts the original low level that should be maintained, and causes reversal to a high level. As a result, the output of the input circuit of the second conventional example which receives this high level switches from a high level towards a low level, thereby disrupting the original level of output terminal 2. However, as is clear from FIG. 6, this type of phenomenon does not occur in the input circuit of the present invention.

Furthermore, in FIG. 5, the electric current of the first electric current route shows a positive value, and the electric current of the second electric current route shows a negative value, however, this simply signifies a difference in the direction of electric current flow. In FIG. 5, the direction of the electric current flowing into the input circuit is designated as positive, while the direction of the electric current flowing out from the input circuit is designated as negative.

Consequently, in the case when the electric potential of input terminal 1 in FIG. 5 is zero, the electric current of the first electric current route flowing into the power source terminal assumes a positive value, and the electric current of the second electric current route flowing out from the input terminal takes on a negative value.

Incidentally, the case in which an input circuit is utilized, in particular, as a means for receiving data signals in data transmission over different integrated circuits using a transmission circuit such as a bus line or the like is explained at the beginning of the prior art. Normally, in a transmission circuit such as a bus line or the like, the transmission of a stable signal with little distortion can be performed by means of matching the impedances of the transmitting and receiving sides. As a result, with regard to a transmission circuit such as a bus line or the like, a fixed impedance for the receiving end is ordinarily desirable regardless of the presence of a connection with the input circuit. Consequently, even in the case when the input circuit is connected to the transmission circuit, the aforementioned requires that the impedance be as high as possible in order to avoid change in the impedance at the transmission circuit receiving end.

According to a first preferred embodiment shown in FIG. 1, the base of PNP transistor 3 is connected to the emitter of PNP transistor 6, hence PNP transistor 3 contributes to the transmission of a signal applied to input terminal 1 which changes from a high level to a low level. In addition, PNP transistor 6 contributes to the transmission of a signal applied to input terminal 1 which changes from a low level to a high level, in the same manner as described above. In other words, this means that PNP transistor 3 and PNP transistor 6 each mutually maintain either a conducting state or a nonconducting state, depending on the signal change applied to input terminal 1. The numerical equation for the input impedance in the present input circuit shown in FIG. 1 is divided into two parts as shown in the following.

I. In the case when the signal applied to input terminal 1 changes from a high level to a low level, in other words when PNP transistor 3 is in a conducting state, then the following applies:

$$ZinQ3 = (\beta Q3 / gmQ3) + ZP7 \times (\beta Q3 + 1) \tag{1}$$

[in the equation, ZinQ3 is the input impedance when PNP transistor 3 is in a conducting state; βQ3 is the forward electric current gain of PNP transistor 3; gmQ3 is the mutual conductance of PNP transistor 3; ZP7 is the output impedance of PMOS transistor 7; wherein ZinQ3=22.3 kΩ when conducting calculations according to equation (1)].

Here, βQ3=10; gmQ3=38 (mA/V), and ZP7=2 kΩ. In other words, the input impedance reaches a significantly large value of several tens of kΩ when PNP transistor 3 is in a conducting state.

II. In the case when the signal applied to input terminal 1 changes from a low level to a high level, in other words when PNP transistor 6 is in a conducting state, then the following applies:

$$ZinQ6 = \alpha Q6 \times (gmQ6^{-1} + ZN8,9) \tag{2}$$

whereas, αQ6=βQ6/(1+βQ6) and $$ZN8,9 = ZN8 + ZN9$$

[in the equation, ZinQ6 is the input impedance when PNP transistor 6 is in a conducting state; βQ6 is the forward electric current gain of PNP transistor 6; gmQ6 is the mutual conductance of PNP transistor 6; ZN8 is the output impedance of NMOS transistor 8; and ZN9 is the output impedance of NMOS transistor 9; wherein ZinQ6=934 Ω when conducting calculations according to equation (2)].

Here, βQ6=10; gmQ6=38 (mA/V), and ZN8+ZN9=1 kΩ. In other words, the input impedance is a comparatively small value of several hundred of Ω when PNP transistor 6 is in a conducting state.

As mentioned above, the input impedance when PNP transistor 6 is conducting is comparatively small, and as a result, as explained in the aforementioned, when an input circuit is connected to the transmission circuit, a change occurs in the impedance at the transmission circuit receiving end. As a result, the input circuit of the present embodiment shown in FIG. 1 requires a countermeasure for obtaining the highest input impedance possible, in particular when PNP transistor 6 is in a conducting state.

In the following, an input circuit incorporating such as countermeasure according to a second preferred embodiment of the present invention will be explained using FIG. 2.

Figure 2:
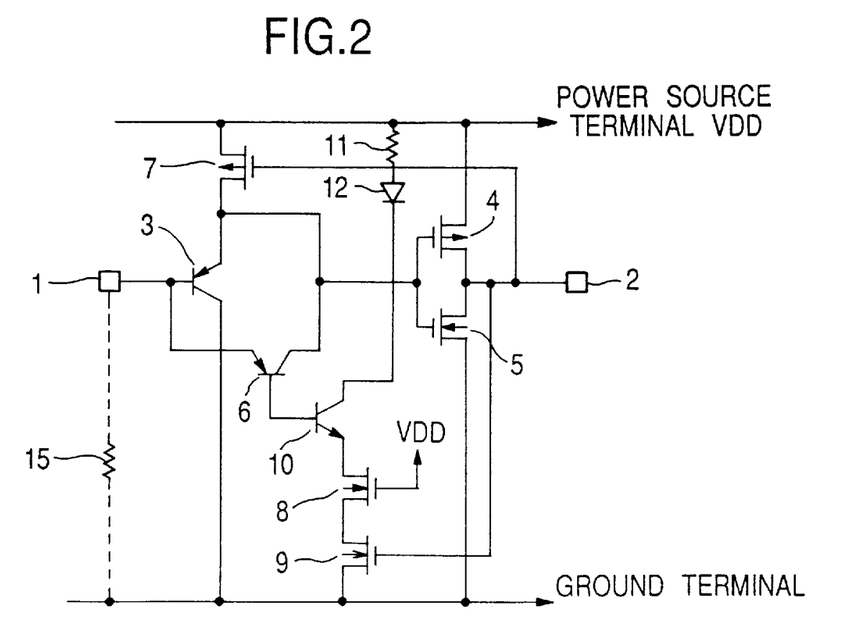
FIG. 2 is a circuit diagram according to a second preferred embodiment of the present invention.

In FIG. 2, the base of PNP transistor 3 and emitter of PNP transistor 6 are connected respectively to input terminal 1. In addition, the drain of PMOS transistor 7, gate of PMOS transistor 4, gate of NMOS transistor 5 and collector of PNP transistor 6 are connected respectively to the emitter of PNP transistor 3. The base of a NPN bipolar transistor 10 (hereafter abbreviated as "NPN transistor") is connected to the base of PNP transistor 6, and the drain of NMOS transistor 8 is connected to the emitter of this NPN transistor 10. The drain of NMOS transistor 9 is connected to the source of NMOS transistor 8. The drain of PMOS transistor 4, drain of NMOS transistor 5, gate of PMOS transistor 7, and gate of NMOS transistor 9 are connected respectively to output terminal 2. The cathode of a diode 12 is connected to the collector of NPN transistor 10, and the anode of diode 12 is connected to one terminal of a resistance component 11. The source of PMOS transistor 4, source of PMOS transistor 7, the other terminal of resistance component 11 and gate of NMOS transistor 8 are connected respectively to power source terminal VDD. The collector of PNP transistor 3, source of NMOS transistor 5 and source of NMOS transistor 9 are respectively grounded.

In the following, the operation of a second preferred embodiment of the present invention will be explained. In FIG. 2, a state is assumed in which 3 V is supplied to power source terminal VDD, while a high level 5 V signal is applied to input terminal 1 from another integrated circuit. The operation in this case is essentially identical to that of the first preferred embodiment shown in FIG. 1. In other words, in this situation, since a reverse bias state occurs between the emitter and base of PNP transistor 3, the 5 V electric potential of input terminal 1 is not propagated to the emitter of PNP transistor 3. In this state, PMOS transistor 7 maintains a state of conducting, and as a result, a 3 V electric potential, equal to that of power source terminal VDD is supplied to the respective gates of PMOS transistor 4 and NMOS transistor 5. Consequently, destruction of the gate oxide films of PMOS transistor 4 and NMOS transistor 5 does not occur. According to this state, PMOS transistor 4 assumes a nonconducting state with NMOS transistor 5 in a conducting state. As a result, a converted level equal to the low level of the ground electric potential is maintained by output terminal 2, and this level is propagated in an unaltered form to the internal circuitry of an integrated circuit connected to output terminal 2.

At the same time, by means of a low level in output terminal 2, PMOS transistor 7 is maintained in a conducting state, as explained above, while NMOS transistor 9 is maintained in a nonconducting state. Consequently, the electric current routes of forward directional bias between the emitter and base of PNP transistor 6, and between the emitter and base of NPN transistor 10, are interrupted (cut off) by means of utilizing NMOS transistor 9, thereby maintaining a nonconducting state. Normally, NMOS transistor 8 assumes a conducting state in order to prevent the destruction of the gate oxide film of NMOS transistor 9.

The electric potential of the NPN transistor 10 emitter is reduced only by a value of (VEB+VBE) from the 5 V electric potential applied to input terminal 1. Here, VEB represents the forward voltage flowing between the emitter and base of PNP transistor 6, and VBE represents the forward voltage flowing between the emitter and base of NPN transistor 10. Normally, VEB and VBE each show a value of approximately 0.7 V, and thus the emitter electric potential of NPN transistor 10 is approximately 3.7 V. However, only an electric potential, which has been reduced by a value of VTN from the 3 V electric potential supplied to power source terminal VDD via NMOS transistor 8, is applied to the drain of NMOS transistor 9. As a result, normally, destruction of the gate oxide film of NMOS transistor 9 does not occur when the aforementioned 3.6 V is applied to the drain of NMOS transistor 9. However, transmission of noise and reflected waves from other integrated circuits and transmission circuits to input terminal 1 occur rarely where peak electric potentials exceeding a value of 10 V are not uncommon, which in this case would result in the application of an electric potential exceeding 8 V to the drain of NMOS transistor 9.

Consequently, even in the second preferred embodiment, it is necessary to protect the gate oxide film of NMOS transistor 9 by means of NMOS transistor 8. In addition, diode 12 is provided for interrupting (cutting off) the electric current route from the base towards the collector of NPN transistor 10 in the case when the base electric potential of NPN transistor 10 exceeds the collector electric potential of this NPN transistor 10. Hence, this diode 12 holds the capacity to function as a third electric current cut off means.

On the other hand, in FIG. 2, a state is now assumed in which 3 V is supplied to power source terminal VDD with the signal from the other integrated circuit to input terminal 1, described in the aforementioned, changing from a high level to a low level (ground electric potential). In this case, a reduced electric potential which is converted from a 5 V electric potential to a ground electric potential is applied to the base of PNP transistor 3. In addition, since PNP transistor 3 switches from a nonconducting state to a conducting state, the emitter electric potential of PNP transistor 3 switches from the power source electric potential towards the ground electric potential. The gates of PMOS transistor 4 and NMOS transistor 5 are connected respectively to the emitter of PNP transistor 3. As a result, PMOS transistor 4 switches from a nonconducting state to a conducting state, while NMOS transistor 5 switches from a conducting state to a nonconducting state. Consequently, output terminal 2 converts from a low level to a high level, which is followed by the conversions of PMOS transistor 7 from a conducting state to a nonconducting state, and NMOS transistor 9 from a nonconducting state to a conducting state.

By means of using PMOS transistor 7, the electric current route between the emitter and base of PNP transistor 3 is interrupted, and PNP transistor 3 switches accordingly from a conducting state to a nonconducting state. In addition, by means of using NMOS transistor 9, electric current routes between the emitter and base of PNP transistor 6, and between the emitter and base of NPN transistor 10 are formed (connected), and thus PNP transistor 6 and NPN transistor 10 each switch accordingly from a nonconducting state to a conducting state. Resistance component 11 serves to suppress the electric current generated at the time of NPN transistor 10 release.

At the point when the signal applied from the other integrated circuit to input terminal 1 completely reaches the ground electric potential, PMOS transistor 7 and PMOS transistor 4 are maintained in a nonconducting state, while NMOS transistor 5 and NMOS transistor 9 are maintained in a conducting state. Consequently, output terminal 2 maintains a high level equal to the 3 V electric potential of the power source terminal VDD, and this level is propagated in an unaltered form to the internal circuitry of the integrated circuit connecting with output terminal 2.

As explained above, even in the case when a low level signal is applied to input terminal 1 by means of another integrated circuit, since PMOS transistor 7 maintains a nonconducting state, an electric current route flowing from the power source terminal VDD to the emitter of PNP transistor 3 does not exist. Consequently, a first electric current route flowing from the power source terminal VDD towards the ground, and a second electric current route flowing from the power source terminal VDD towards input terminal 1 do not exist as in the aforementioned second conventional example. In other words, the problems posed by the second conventional example are completely solved in a manner similar to the first preferred embodiment.

The input impedance when PNP transistor 6 is in a conducting state will be calculated in the following. In the case when the signal applied to input terminal 1 changes from a low level to a high level, in other words when PNP transistor 6 and NPN transistor 10 are in a conducting state, then the following applies:

$$ZinQ60 = \alpha Q6 \times [gmQ6^{-1} + \beta Q10 \, (gmQ10^{-1} + ZN8,9) \quad (3)$$

whereas, $\alpha Q6 = \beta Q6/(1+\beta Q6)$ and $$ZN8,9 = ZN8 + ZN9$$

[in the equation, ZinQ60 is the input impedance when PNP transistor 6 and NPN transistor 10 are in a conducting state; $\beta Q6$ is the forward electric current gain of PNP transistor 6; gmQ6 is the mutual conductance of PNP transistor 6; $\beta Q10$ is the forward electric current gain of NPN transistor 10; gmQ10 is the mutual conductance of NPN transistor 10; ZN8 is the output impedance of NMOS transistor 8; and ZN9 is the output impedance of NMOS transistor 9; wherein ZinQ60=53.2 kΩ when conducting calculations according to equation (3)].

Here, $\beta Q6=10$; gmQ6=38 (mA/V), $\beta Q10=50$, gmQ10=38 (mA/V), and ZN8+ZN9=1 kΩ.

In other words, the input impedance assumes a significantly large value of several tens of kΩ when PNP transistor 6 and NPN transistor 10 are in a conducting state. When compared with the first preferred embodiment, this value is approximately 57 times larger than the value obtained with the first preferred embodiment. Thus, the improved effect obtained over the first preferred embodiment is obvious. In this manner, NPN transistor 10 functions as an input impedance controlling means.

Furthermore, the input impedance when a signal applied to input terminal 1 changes from a high level to a low level, in other words when PNP transistor 3 is in a conducting state, is identical to that obtained in the first preferred embodiment described above, and thus an explanation will be omitted.

Figure 7:
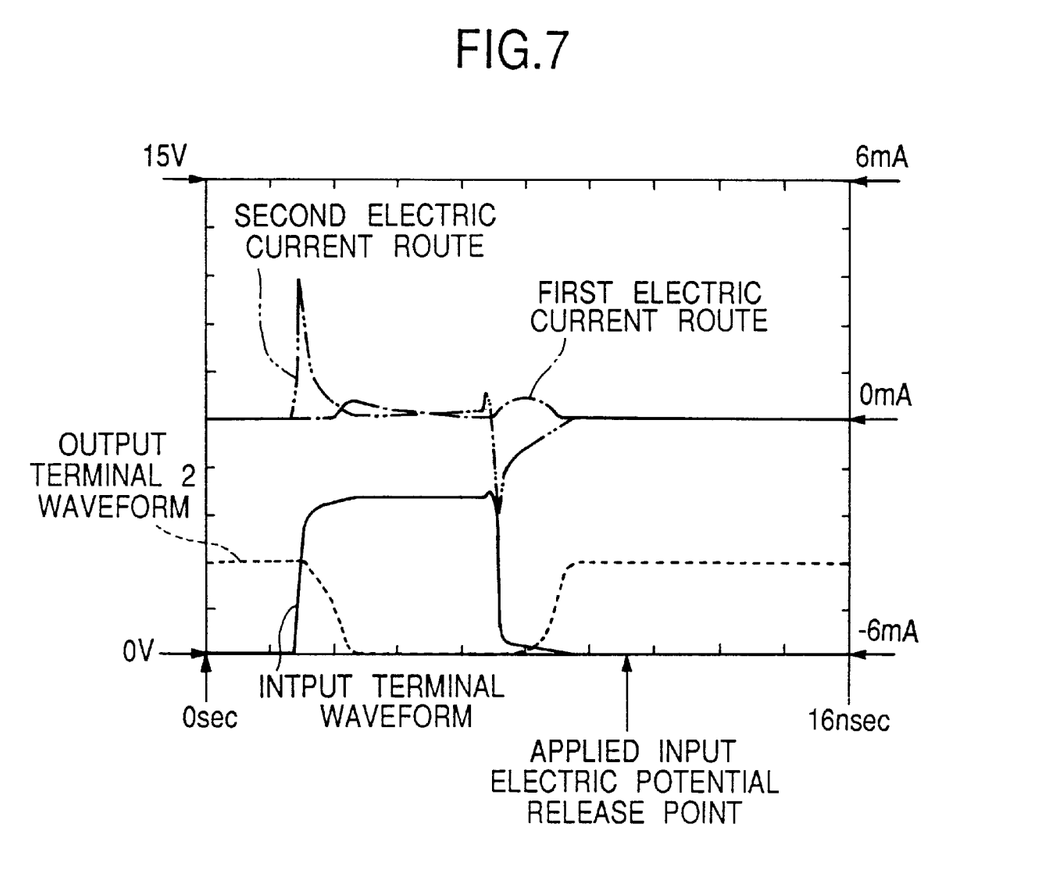
FIG. 7 is a diagram showing a characteristic simulation according to a second preferred embodiment of the present invention.

FIG. 7 is a diagram of a characteristic simulation showing an operation of an input circuit according to a second preferred embodiment of the present invention shown in FIG. 2. As seen clearly from FIG. 7, in the input circuit of the present invention shown in FIG. 2, the electric currents flowing over the aforementioned first and second electric current routes are both zero. In addition, according to this same figure, even when the input applied electric potential is released, disruption of the low level to input terminal 1 does not occur. Consequently, according to the aforementioned second preferred embodiment, an input impedance of approximately 57 times greater than that of the first preferred embodiment is obtained, while also maintaining the electric current route cut off effect of the first preferred embodiment.

Furthermore, in the aforementioned, a state was assumed for an integrated circuit in which its own power source electric potential was 3 V, with a 5 V high level electric potential applied to an input terminal from another integrated circuit. However, these numbers were simply selected out of convenience for the sake of explaining the circuit operation; for example, a state in which an integrated circuit power source electric potential of 5 V, with a 10 V high level electric potential applied to an input terminal therein from another integrated circuit will also pose no problems with regard to the circuit operation.

As described in the aforementioned, according to the input circuit of the present invention, with regard to two bipolar transistors for respectively propagating a high or low level signal applied to the input terminal, by means of providing a cut off means for cutting off the electric current routes from the power source terminal to the ground terminal, and from the input terminal to the ground terminal, even when a low level signal is applied to the aforementioned input terminal, it is possible to completely cut off the steady-state electric currents flowing from the power source terminal to the ground terminal and from the power source terminal to the input terminal, respectively. As a result, it is possible to avoid an increase in the calorific value which normally accompanies an increase in the electric power and steady-state electric current of an integrated circuit.

In addition, even in the case when a pull-down resistance is inserted in between the input terminal and ground terminal in order to avoid an indeterminate level which theoretically accompanies input terminal release, it is possible to completely cut off the steady-state electric current flowing from the power source terminal to the input terminal as described in the aforementioned. As a result, an electric potential generated by flow of the electric current over the aforementioned pull-down resistance does not exist, such that disruption of a fixed low level by means of the pull-down resistance does not occur.

Furthermore, even when an electric potential greater than that of the power source terminal is applied to the input terminal and the power source electric potential is cut off, by means of maintaining the two bipolar transistors connected to the input terminal in a nonconducting state, propagation of the aforementioned input terminal electric potential does not occur. Consequently, destruction of the gate oxide films of the MOS transistors within the input circuit does not occur.

Additionally, use of the aforementioned bipolar transistors avoids the necessity of the MOS transistors used in the preventing the destruction of the gate oxide films of the input circuit in a CMOS integrated circuit. This aspect consequently results in a drastic reduction in the corresponding area.

What is claimed is:

1. An input circuit comprising:

an input terminal which receives an external signal;

a first power terminal which receives a first electric potential;

a second power terminal which receives a second electric potential which is lower than said first electric potential of said first power terminal;

an inverting buffer which inverts a logic level of said external signal and propagates an output signal in response thereto;

a first bipolar transistor which propagates said external signal from said input terminal to said buffer after said external signal falls from a logic high level to a logic low level;

a second bipolar transistor which propagates said external signal from said input terminal to said buffer after said external signal rises from said logic low level to said logic high level;

a first electric current cut off switch which cuts off an electric current route formed between said first bipolar transistor terminal when said buffer outputs said logic high level;

a second electric current cut off switch which cuts off an electric current route formed between said second bipolar transistor and said second power terminal when said buffer outputs said logic low level; and a voltage clamping circuit which provides an electric potential which is lower than the electric potential of said first power terminal to said second electric current cut off switch.

2. The input circuit according to claim 1, wherein each of said first and second electric current cut off switches comprises a MOS transistor.

3. The input circuit according to claim 1, wherein said inverting buffer comprises a p-channel MOS transistor and an n-channel MOS transistor.

4. An input circuit according to claim 1, wherein said voltage clamping circuit comprises a MOS transistor.

5. An input circuit according to claim 1, wherein said second power source terminal is a ground terminal.

6. The input circuit according to claim 1, wherein:

each of said first and second electric current cut off switches comprises a MOS transistor, said buffer comprises a p-channel MOS transistor and a n-channel MOS transistor, said voltage clamping circuit comprises a MOS transistor, and said second power terminal is a ground terminal.

7. An input circuit comprising:

an input terminal which receives an external signal;

first power terminal which receives a first electric potential;

a second power terminal which receives a second electric potential which is lower than said first electrical potential of said first power terminal;

an inverting buffer which inverts a logic level of said external signal and propagates an output signal in response thereto to an integrated circuit;

a first active device which propagates said external signal from said input terminal to said buffer after said external signal falls from a logic high level to a logic low level;

a second active device which propagates said external signal from said input terminal to said buffer when after said external signal rises from said logic low level to said logic high level;

an input impedance circuit which adjusts the input impedance of said second active device;

a first electric current cut off switch which cuts off an electric current route formed between said first active device and said first power terminal when said buffer outputs said logic high level;

a second electric current cut off switch which cuts off an electric current route formed between said second active device an said second power terminal when said buffer outputs said logic low level;

a third electric current cut off switch which cuts off an electric current route formed between said input impedance circuit and said first power terminal; and a voltage clamping circuit which provides an electric potential which is lower than the electric potential of said first power terminal, to said second electric current cut off switch.

8. An input circuit according to claim 7, wherein said active devices each comprise bipolar transistors.

9. An input circuit according to claim 8, wherein said first electric current cut off switch and said second electric current cut off switch each comprise a MOS transistor.

10. The input circuit according to claim 8, wherein said buffer comprises a p-channel MOS transistor and a n-channel MOS transistor.

11. An input circuit according to claim 8, wherein said voltage clamping circuit comprises a MOS transistor.

12. An input circuit according to claim 8, wherein said second power source terminal is a ground terminal.

13. An input circuit according to claim 8, wherein:

said first electric current cut off switch and said second electric current cut off switch each comprise a MOS transistor, said buffer comprises a p-channel MOS transistor and an n-channel MOS transistor, said voltage clamping circuit comprises a MOS transistor, and said second power terminal is a ground terminal.

14. The input circuit as claimed in claim 7 wherein said input impedance circuit comprises a switch having an input connected to an input of said second active device.

15. The input circuit as claimed in claim 7 wherein said third electric current cut off switch comprises a diode.

* * * * *